United States Patent
Wu et al.

(10) Patent No.: US 10,879,051 B2
(45) Date of Patent: Dec. 29, 2020

(54) METHOD FOR CONTROLLING EXPOSURE REGION IN BEVEL ETCHING PROCESS FOR SEMICONDUCTOR FABRICATION

(71) Applicant: Taiwan Semiconductor Manufacturing Co., Ltd., Hsinchu (TW)

(72) Inventors: Chun-Hsing Wu, Zhubei (TW); Hung-Jui Chang, Changhua County (TW); Chih-Ching Cheng, Xizhou Township, Changhua County (TW); Yi-Wei Chiu, Kaohsiung (TW); Kun-Cheng Chen, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 755 days.

(21) Appl. No.: 15/592,523

(22) Filed: May 11, 2017

(65) Prior Publication Data

US 2018/0151335 A1    May 31, 2018

Related U.S. Application Data

(60) Provisional application No. 62/427,201, filed on Nov. 29, 2016.

(51) Int. Cl.
| | | |
|---|---|---|
| *H01L 21/00* | (2006.01) | |
| *H01J 37/32* | (2006.01) | |
| *H01L 21/3065* | (2006.01) | |
| *H01L 21/02* | (2006.01) | |

(52) U.S. Cl.
CPC .. *H01J 37/32651* (2013.01); *H01J 37/32027* (2013.01); *H01J 37/32036* (2013.01); *H01J 37/32467* (2013.01); *H01J 37/32477* (2013.01); *H01L 21/02021* (2013.01); *H01L 21/3065* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 5,919,332 A | * | 7/1999 | Koshiishi | C23C 16/5096 118/723 E |
| 7,513,214 B2 | * | 4/2009 | Okumura | H01J 37/32623 118/723 E |
| 2005/0263484 A1 | * | 12/2005 | Park | H01J 37/32623 216/59 |

(Continued)

*Primary Examiner* — Sylvia Macarthur
*Assistant Examiner* — Michelle Crowell
(74) *Attorney, Agent, or Firm* — McClure, Qualey & Rodack, LLP

(57) ABSTRACT

A plasma processing apparatus is provided. The apparatus includes a lower sheltering module. The apparatus further includes an upper sheltering module arranged adjacent to the lower sheltering module. The apparatus includes an upper plate and an upper PEZ ring positioned around the upper plate. The apparatus also includes a shadowing unit that includes a number of engaging parts in the form of arcs detachably positioned on the upper PEZ ring. In addition, the apparatus includes a plasma generation module for generating plasma in the peripheral region of the lower sheltering module and the upper sheltering module.

20 Claims, 7 Drawing Sheets

(56) References Cited

U.S. PATENT DOCUMENTS

| | | | |
|---|---|---|---|
| 2007/0068900 A1* | 3/2007 | Kim | H01J 37/32357 216/67 |
| 2008/0227301 A1* | 9/2008 | Fang | H01J 37/32642 438/706 |
| 2009/0114244 A1* | 5/2009 | Sexton | B08B 7/0035 134/1.1 |
| 2009/0188627 A1* | 7/2009 | Fang | H01J 37/32091 156/345.43 |
| 2009/0325382 A1* | 12/2009 | Yu | H01L 21/02087 438/692 |
| 2011/0206833 A1* | 8/2011 | Sexton | H01J 37/32532 427/78 |
| 2015/0099365 A1* | 4/2015 | Chen | H01L 21/02087 438/710 |
| 2015/0318150 A1* | 11/2015 | Fischer | H01J 37/3255 438/713 |

* cited by examiner

METHOD FOR CONTROLLING EXPOSURE REGION IN BEVEL ETCHING PROCESS FOR SEMICONDUCTOR FABRICATION

PRIORITY CLAIM AND CROSS-REFERENCE

This application claims the benefit of U.S. Provisional Application No. 62/427,201, filed on Nov. 29, 2016, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of materials over a semiconductor substrate, and patterning the various material layers using lithography to form an integrated circuit (IC) and elements thereon. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

During the manufacturing of semiconductor devices, various processing steps are used to fabricate integrated circuits on a semiconductor wafer. Plasma etch processes in combination with additional process steps in the standard process flow have been developed and implemented in the manufacturing process for semiconductor products utilizing trench technology for successful reduce defect.

Although existing methods and devices have resulted in a reduction in defect, they have not been entirely satisfactory in all respects. Consequently, it would be desirable to provide a solution for process control in semiconductor manufacturing operations.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
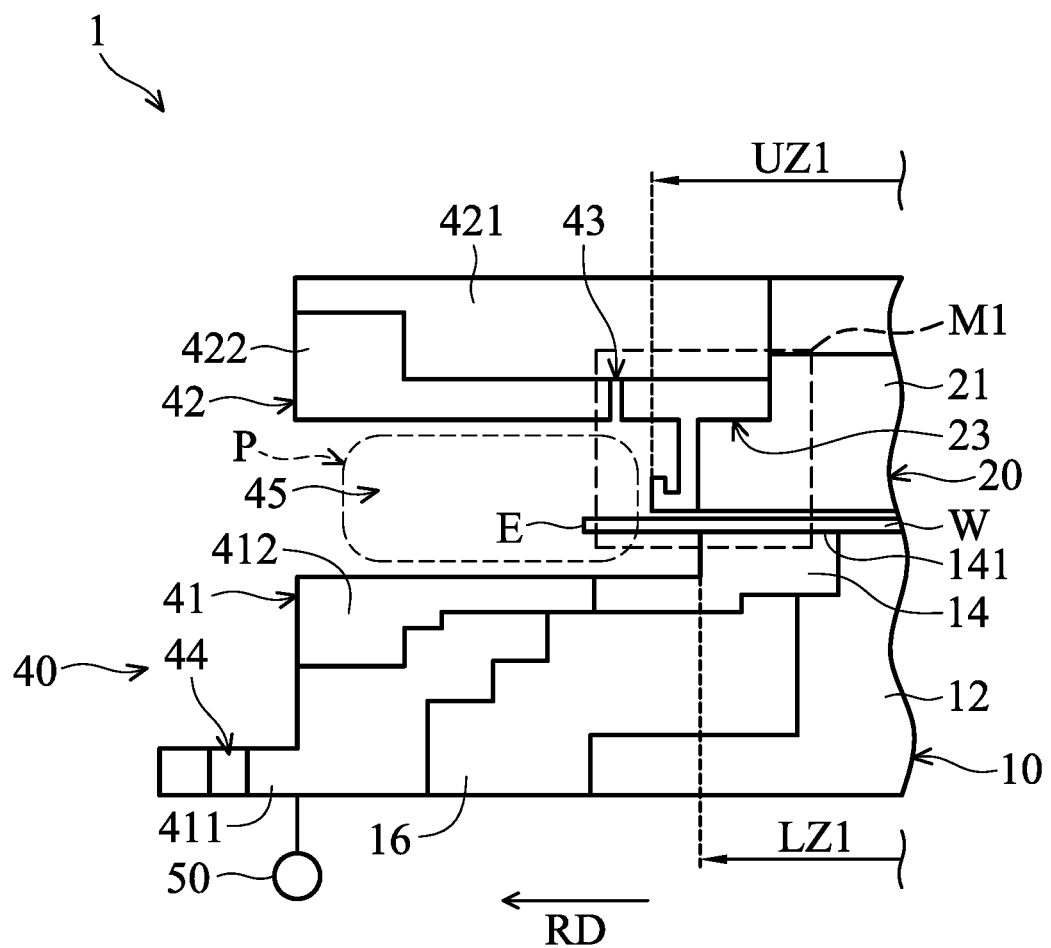
FIG. 1 is a schematic cross-sectional view of a plasma processing apparatus operated in a first state in which an upper PEZ ring is available for hanging other element to increase the size of an upper plasma exclusion zone, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIG. 1 is schematic cross-sectional view of a plasma processing apparatus 1 operating in a first state, in accordance with some embodiments. In some embodiments, the plasma processing apparatus 1 is configured to perform a bevel etching process to a wafer W. In the embodiment shown in FIG. 1, the plasma processing apparatus 1 has a shape that is generally axially symmetric, and a part of the cross section is shown in FIG. 1, but the embodiments are not limited thereto. In the following descriptions, the term plasma exclusion zone refers to an area of the wafer W where the plasma used for cleaning the wafer edge is excluded.

The plasma processing apparatus 1 operating in the first state includes a lower sheltering module 10, an upper sheltering module 20 and a plasma generation module 40. The elements of the plasma processing apparatus 1 can be added to or omitted, and the disclosure should not be limited by the embodiments.

In some embodiments, the lower sheltering module 10 includes a wafer holder stage 12, a lower plasma exclusion zone (PEZ) ring 14, and a lower dielectric ring 16. The wafer holding stage 12 is used to hold the wafer W during the bevel etching process. In some embodiments, the wafer holding stage 12 includes an electrostatic chuck (ESC) for securing the wafer W. The wafer holding stage 12 may be coupled to a radio frequency (RF) power source (not shown) for biasing the wafer W, which helps direct charged plasma radix or ions toward the wafer during processing. The lower dielectric ring 16 positioned around the wafer holding stage 12 electrically separates the wafer holding stage 12 from the plasma generation module 40.

The lower PEZ ring 14 is used to protect the wafer holding stage 12 and the lower dielectric ring 16 from being exposed directly to plasma P. In addition, the lower PEZ ring 14 defines the boundary of a lower plasma exclusion zone LZ1 on the back surface of the wafer W where the plasma P used for cleaning the wafer edge is blocked.

In some embodiments, the lower PEZ ring 14 is positioned around the wafer holding stage 12 and includes a top surface 141 for supporting the wafer W. In the radial direction RD, the outer width of the top surface 141 across the wafer holding stage 12 is smaller than the width of the wafer W. As a result, an edge region of the back surface of the wafer W is exposed to the plasma region 45 and not covered by the lower PEZ ring 14. This exposed edge region on the back surface of the wafer W is etched in the bevel etching process.

The lower PEZ ring 14 can be formed of an electrically conductive, semiconductive or dielectric material, such as a ring made entirely of quartz, aluminum oxide (Al2O3), aluminum nitride (AlN), titanium dioxide (TiO2), silicon oxide (SiO2), silicon carbide (SiC), silicon nitride (Si3N4), silicon (Si), yttria (Y2O3) or another material. Alternatively, the lower PEZ ring 14 can be a composite ring of metal, ceramic or polymer. The lower PEZ ring 14 may be coated with an anti-corrosion material such as Si, SiC or Y2O3 to reduce contamination of the substrate W during the plasma etching.

The upper sheltering module 20 includes an upper plate 21 and an upper PEZ ring 23, in accordance with some embodiments. The upper plate 21 is made of a dielectric material such as ceramic. The upper plate 21 is positioned facing the wafer holder stage 12. The upper plate 21 is spaced a suitable distance apart from the wafer W held by the wafer holder stage 12. As such, scratches occurring on the front surface of the wafer W during the plasma process can be avoided.

The upper PEZ ring 23 is used to protect the upper plate 21 from being directly exposed to plasma. In addition, the upper PEZ ring 23 defines the boundary of an upper plasma exclusion zone UZ1 on the front surface of the wafer W where the plasma P used for cleaning the wafer edge is blocked while the plasma processing apparatus 1 is being operated in a first state.

Figure 2:
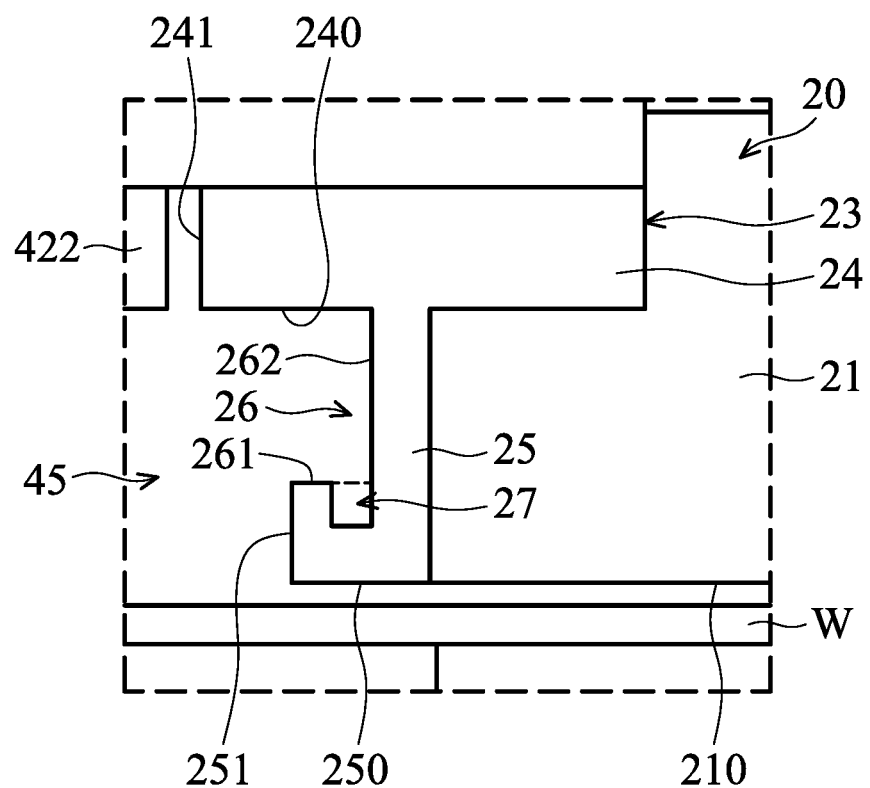
FIG. 2 is a schematic cross-sectional view of an upper PEZ ring, in accordance with some embodiments.

FIG. 2 shows an enlarged view of the region M1 in FIG. 1. In some embodiments, the upper PEZ ring 23 is positioned around the upper plate 21. The upper PEZ ring 23 includes a base portion 24 and a connecting portion 25. The connecting portion 25 is projected from a bottom surface 240 of the base portion 24 toward to the lower PEZ ring 14 (FIG. 1). In some embodiments, the bottom surface 250 of the connecting portion 25 is flush with the bottom surface 210 of the upper plate 21. The distance between the bottom surface 250 to the wafer W during the bevel etching process is less than 3 mm to limit the entrance of the plasma into the space between the upper sheltering module 20 and the wafer W. However, the disclosure should not be limited to the embodiments.

The connecting portion 25 is configured for receiving a shadowing unit 30, which will be described in detail with reference to FIG. 3, and has a recess 26 for accommodating a corresponding part of the shadowing unit 30. In some embodiments, the recess 26 continuously surrounds the connecting surface 251 of the connecting portion 25, wherein the connecting surface 251 is the outermost surface of the connecting portion 25 in the radial direction RD and is immediately connected to the bottom surface 250 of the connecting portion 25.

The lower wall 261 of the recess 26 is distant from the bottom surface 250, and the recess 26 is not connected to the bottom surface 250 of the connecting portion 25. In the embodiments shown in FIG. 2, in addition to the recess 26, a groove 27 is formed at the lower wall 261 of the recess 26 and connected to the inner wall 262 of the recess 26.

The outer width W1 (FIG. 5) of the connecting portion 25 is smaller than the diameter of the wafer, wherein the outer width here refers to the width of the connecting surface 251. As a result, an edge region of the front surface of the wafer W is exposed to the plasma region 45 and is not covered by the connecting portion 25. This exposed edge region on the front surface of the wafer W is etched in the bevel etching process as the plasma processing apparatus 1 is operating in the first state.

The upper PEZ ring 23 can be formed of an electrically conductive, semiconductive or dielectric material, such as a ring made entirely of quartz, aluminum oxide (Al2O3), aluminum nitride (AlN), titanium dioxide (TiO2), silicon oxide (SiO2), silicon carbide (SiC), silicon nitride (Si3N4), silicon (Si), yttria (Y2O3) or another material. Alternatively, the upper PEZ ring 23 can be a composite ring of metal, ceramic or polymer. The upper PEZ ring 23 may be coated with an anti-corrosion material such as Si, SiC or Y2O3 to reduce contamination of the wafer W during the plasma etching.

Referring to FIG. 1 again, the plasma generation module 40 is configured to generate plasma in the peripheral region of the lower sheltering module 10 and the upper sheltering module 20. In some embodiments, the plasma generation module 40 includes a lower electrode unit 41, an upper electrode unit 42, a gas inlet 43 and an exhaust 44.

The lower electrode unit 41 is positioned on the exterior of the lower sheltering module 10 in the radial direction of RD. The lower electrode unit 41 includes a metal base 411 and an electrode pad 412. The electrode pad 412 is disposed on the metal base 411 and electrically connects to an electrical power supply 50 via the metal base 411.

The upper electrode unit 42 is positioned on the exterior of the upper sheltering module 20 in the radial direction RD. The upper electrode unit 42 includes a metal cover 421 and an electrode pad 422. The electrode pad 422 is disposed on the metal cover 421 and is grounded via the metal cover 421. In some embodiments, the electrode pad 422 is arranged to be flush with the bottom surface 240 of the base portion 24 and faces the electrode pad 412. A plasma region 45 is defined between the electrode pad 412 and the electrode pad 422.

The gas inlet 43 is used to provide plasma source gas into to the plasma region 45, and the exhaust 44 is used to maintain an operating pressure in the plasma region 45. In the embodiments shown in FIG. 1, the gas inlet 43 is located between the upper electrode pad 422 and the upper PEZ ring 23, and the exhaust 44 is formed on the lower electrode unit 41. However, it should be appreciated that many variations and modifications can be made to embodiments of the disclosure. The positions of the gas inlet 43 and the exhaust 44 can be modified on demand.

The wafer W to be processed may be made of silicon or another semiconductor material. Alternatively or additionally, the wafer W may include other elementary semiconductor materials such as germanium (Ge). In some embodiments, the wafer W is made of a compound semiconductor such as silicon carbide (SiC), gallium arsenic (GaAs), indium arsenide (InAs), and indium phosphide (InP). In some embodiments, the wafer W is made of an alloy semiconductor such as silicon germanium (SiGe), silicon germanium carbide (SiGeC), gallium arsenic phosphide (GaAsP), and gallium indium phosphide (GaInP). In some embodiments, the wafer W includes an epitaxial layer. For example, the wafer W has an epitaxial layer overlying a bulk semiconductor. In some other embodiments, the wafer W may be a silicon-on-insulator (SOI) or a germanium-on-insulator (GOI) substrate.

The wafer W may have various device elements. Examples of device elements that are formed in the wafer W include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, a dielectric layer lies on the front surface and a bevel edge of the wafer W and extends below the bevel edge.

During the bevel etching process, the electrical power supply 50 may supply an alternating current (AC) signal or DC signal to the lower electrode unit 41 to energize the gas from the gas inlet 43 to plasma P. If the electrical power supply 50 supplies an AC signal, such as an RF signal, the upper electrode unit 42 works with the lower electrode unit 41 to generate the plasma P and control the ionization rate of the plasma P. If the electrical power supply supplies a DC signal, the upper electrode unit 42 generates a bias to enhance the directionality of the plasma P. As a result, the plasma density distribution in the plasma region 45 is controlled.

Figure 3:
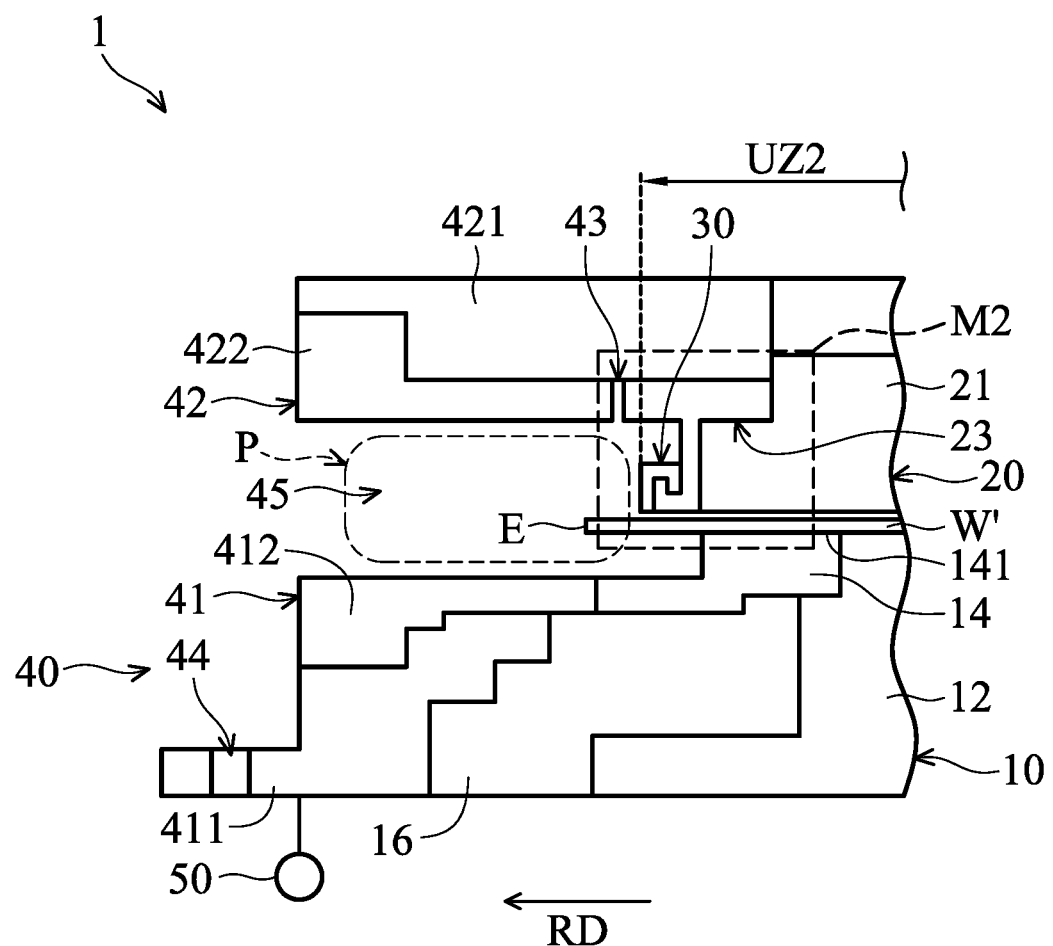
FIG. 3 is a schematic cross-sectional view of a plasma processing apparatus operated in a second state in which an upper PEZ ring is connected to a shadowing unit, in accordance with some embodiments.

FIG. 3 is a schematic cross-sectional view of the plasma processing apparatus 1 operating in a second state, in accordance with some embodiments. The plasma processing apparatus 1 operating in the second state further includes a shadowing unit 30, and another wafer W' is processed by the plasma processing apparatus 1.

The wafer W' is different from the wafer W shown in FIG. 1. For example, wafer W and wafer W' have different devices or dielectric layers having distinct patterns formed thereon. Consequently, plasma exclusion zones of different sizes are arranged to properly reduce defects on the wafer W and wafer W'.

In the embodiment shown in FIG. 3, the upper plasma exclusion zone UZ2 of wafer W' has a greater width than the upper plasma exclusion zone UZ1 (FIG. 1) of wafer W. To increase the width of the upper plasma exclusion zone, the shadowing unit 30 is mounted on the exterior in the radial direction of the wafer W'. Structural features of the shadowing unit 30 are described in more detail below.

Figure 4:
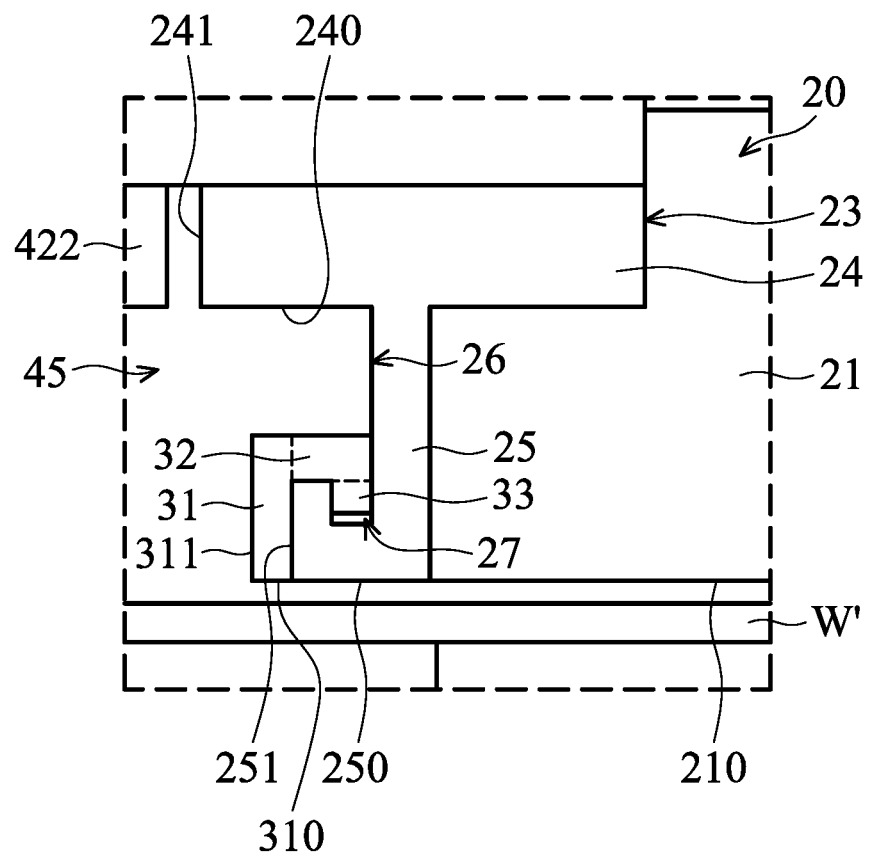
FIG. 4 is a schematic cross-sectional view of a shadowing unit mounted on an upper PEZ ring, in accordance with some embodiments.

FIG. 4 shows an enlarged view of the region M2 in FIG. 3. In some embodiments, the shadowing unit 30 has a substantial cane shape and includes a longitudinal portion 31, an engaging portion 32, and a protrusion 33. The longitudinal portion 31 extends parallel to the connecting portion 25. The engaging portion 32 is perpendicularly connected to the one end of the longitudinal portion 31. The protrusion 33 protrudes downward from the engaging portion 32 and extends parallel to the longitudinal portion 31.

The longitudinal portion 31 is connected to the connecting surface 251 of the connecting portion 25, and the engaging portion 32 is positioned in the recess 26, and the protrusion 33 is positioned in the groove 27. As such, the shadowing unit 30 is securely affixed to the upper PEZ ring 23.

In some embodiments, in a direction that is parallel to the longitudinal direction (perpendicular to the radial direction RD) of the connecting portion 25, the width of the recess 26 is relatively wide for facilitating the insertion of the engaging portion 32 into the recess 26.

In some embodiments, the bottom surface 310 of the longitudinal portion 31 is flush with the bottom surface 250 of the connecting portion 25 and parallel to the wafer W'. However, it should be appreciated that many variations and modifications can be made to embodiments of the disclosure. The distance between the bottom surface 310 and the wafer W' may be different from the distance between the bottom surface 250 and the wafer W'. For example, bottom surface 310 is higher than bottom surface 250. Alternatively, the bottom surface 310 is askew relative to the wafer W'.

Figure 5:
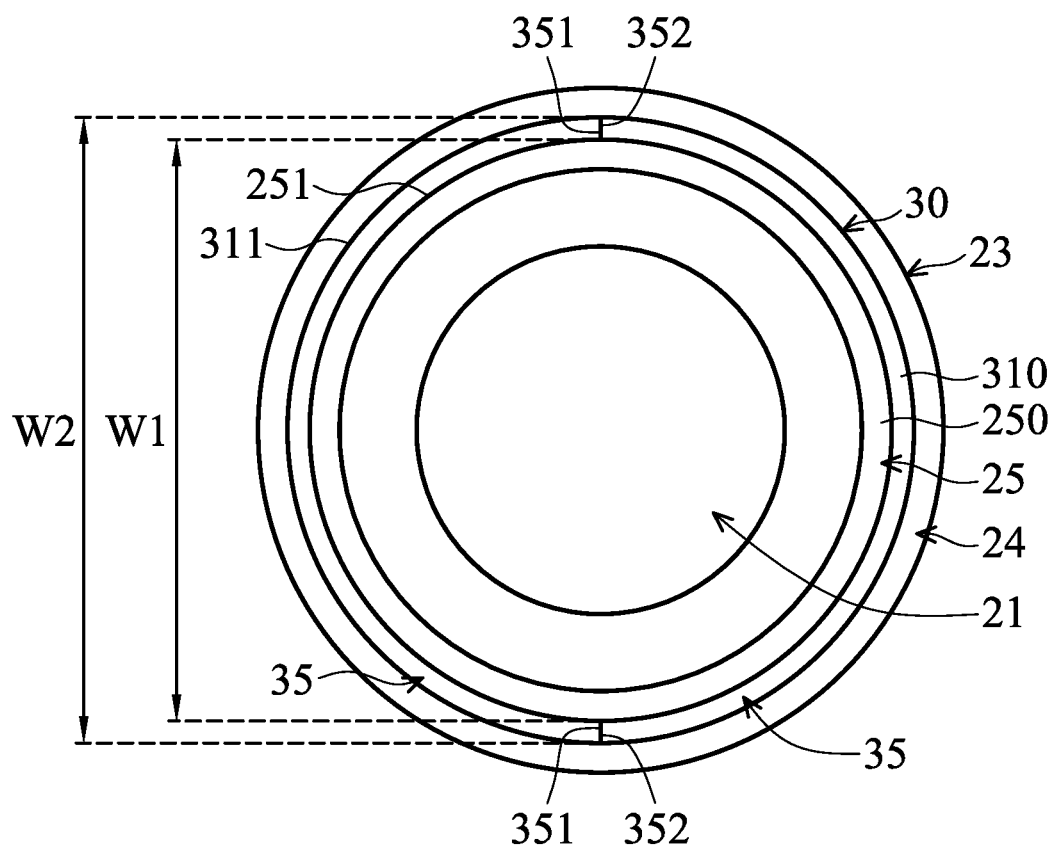
FIG. 5 is a bottom view of a shadowing unit mounted on an upper PEZ ring, in accordance with some embodiments.

FIG. 5 is a bottom view of a shadowing unit mounted on an upper PEZ ring. In some embodiments, the shadowing unit 30 has a circular shape and is constituted by n (n>2) engaging parts 35 in the form of circular arcs having the same radius of curvature and circumferentially positioned on the upper PEZ ring 23. For example, the shadowing unit 30 includes two engaging parts 35, the arc angle of each engaging part 35 is about 180 degrees. The two ends 351 and 352 of one engaging part 35 are connected to the two ends 351 and 352 of the other engaging part 35 so as to construct a substantially circular shape. A gap may be formed between two neighboring ends of the engaging parts 35 to release the thermal stress due to high processing temperatures.

In some embodiments, the outer width W2 of the shadowing unit 30 is smaller than the diameter of the wafer W', wherein the outer width referred to here refers to the width of the outer surface 311 across the upper sheltering module 20. As a result, an edge region of the front surface of the wafer W' is exposed to the plasma region 45 and is not covered by the connecting portion 25 and the shadowing unit 30. This exposed edge region on the front surface of the wafer W' is etched in the bevel etching process as the plasma processing apparatus 1 is operated in the second state.

The shadowing unit 30 can be formed of an electrically conductive, semiconductive or dielectric material, such as quartz, aluminum oxide (Al2O3), aluminum nitride (AlN), titanium dioxide (TiO2), silicon oxide (SiO2), silicon carbide (SiC), silicon nitride (Si3N4), silicon (Si), yttria (Y2O3) or another material. Alternatively, the shadowing unit 30 can be a composite assembly of metal, ceramic or polymer. The shadowing unit 30 may be coated with an anti-corrosion material such as Si, SiC or Y2O3, thereby erosion of the shadowing unit 30 due to the exposure of the processing elements can be avoided.

It should be noted that the shadowing unit 30 can be replaced by another shadowing unit having a longitudinal portion with different widths in the radial direction RD to provide different sized upper plasma exclusion zone. The width of the shadowing unit 30 in the radial direction RD may be equal or less than the distance between the outer surface 241 (FIG. 4) of the base portion 24 and the connecting surface 251 of the connecting portion 25 in the radial direction RD. Namely, the outer surface 311 of the shadowing unit 30 is closer to the upper plate 21 than the outer surface 241 of the base portion 24 in the radial direction RD.

It should be appreciated that the configuration of the upper PEZ ring and the shadowing unit 30 can be modified and should not be limited to the above embodiments. In the description below, some possible exemplary implementations of the upper PEZ ring and the shadowing unit will be illustrated.

Figure 6:
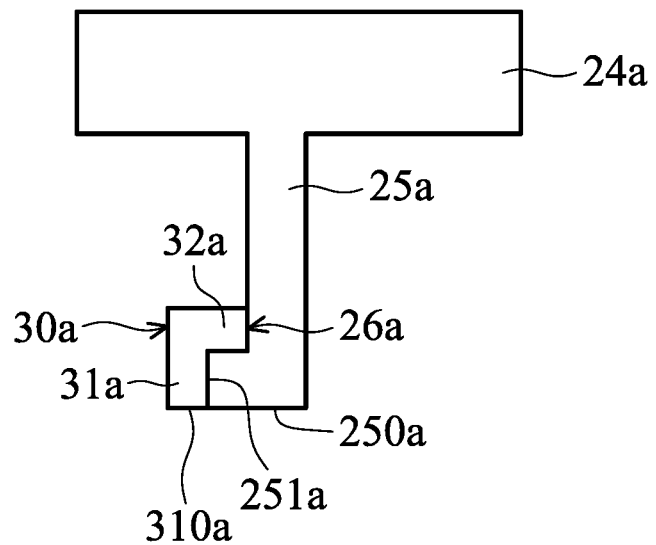
FIG. 6 is a schematic view of a shadowing unit mounted on an upper PEZ ring, in accordance with some embodiments.

FIG. 6 shows a cross-sectional view of a shadowing unit 30a positioned on an upper PEZ ring 23a, in accordance with some embodiments. In the embodiments shown in FIG. 6, elements similar to those shown in FIG. 2 are provided with the same reference numbers, and the features thereof are not reiterated in the interests of brevity.

The upper PEZ ring 23a includes a base portion 24a and a connecting portion 25a. The connecting portion 25a projects downward from a bottom surface 240a of the base portion 24a. The connecting portion 25a has a rectangular recess 26a for accommodating a corresponding part of the shadowing unit 30a. In some embodiments, the recess 26a is circumferentially and continuously formed on the connecting surface 251a of the connecting portion 25a.

The shadowing unit 30a has a substantial L-shape and includes a longitudinal portion 31a and an engaging portion 32a. The longitudinal portion 31a extends parallel to the connecting portion 25a. The engaging portion 32a is perpendicularly connected to one end of the longitudinal portion 31.

When the shadowing unit 30a is positioned on the upper PEZ ring 23a, the longitudinal portion 31a is connected to the connecting surface 251a of the connecting portion 25a, and the engaging portion 32a is positioned in the recess 26a. As such, the shadowing unit 30a is securely affixed to the upper PEZ ring 23a. In addition, the bottom surface 250a of the connecting portion 25a is located on the same plane as the bottom surface 310a of the longitudinal portion 31a to define a plasma exclusion zone.

Figure 7:
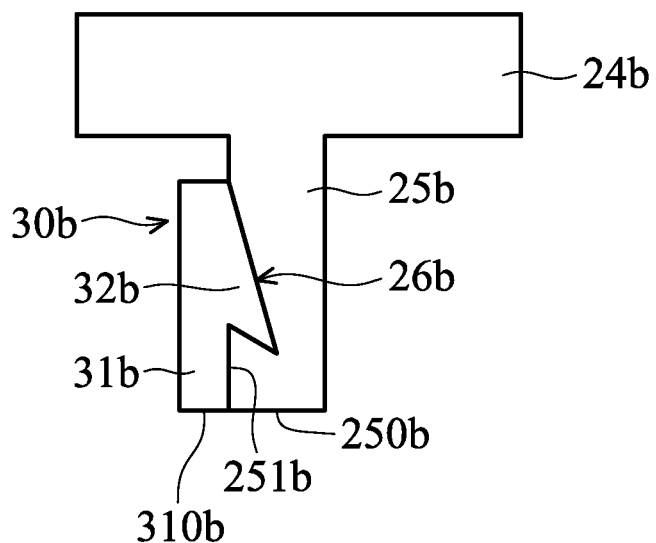
FIG. 7 is a schematic view of a shadowing unit mounted on an upper PEZ ring, in accordance with some embodiments.

FIG. 7 shows a cross-sectional view of a shadowing unit 30b positioned on an upper PEZ ring 23b, in accordance with some embodiments. In the embodiments shown in FIG. 7, elements similar to those shown in FIG. 2 are provided with the same reference numbers, and the features thereof are not reiterated in the interests of brevity The upper PEZ ring 23b includes a base portion 24b and a connecting portion 25b. The connecting portion 25b projects downward from the bottom surface 240b of the base portion 24b. The connecting portion 25b has a triangular recess 26b for accommodating a corresponding part of the shadowing unit 30b. In some embodiments, the recess 26b is circumferentially and continuously formed on the connecting surface 251b of the connecting portion 25b.

The shadowing unit 30b has a hook shape and includes a longitudinal portion 31b and an engaging portion 32b. The longitudinal portion 31b extends parallel to the connecting portion 25b. The engaging portion is perpendicularly connected to one end of the longitudinal portion 31 and has a tapered shape.

When the shadowing unit 30b is positioned on the upper PEZ ring 23b, the longitudinal portion 31b is connected to the connecting surface 251b of the connecting portion 25b, and the engaging portion 32b is positioned in the recess 26b. As such, the shadowing unit 30b is securely affixed to the upper PEZ ring 23b. In addition, the bottom surface 250b of the connecting portion 25b is located on the same plane as the bottom surface 310b of the longitudinal portion 31b to define a plasma exclusion zone.

Figure 8:
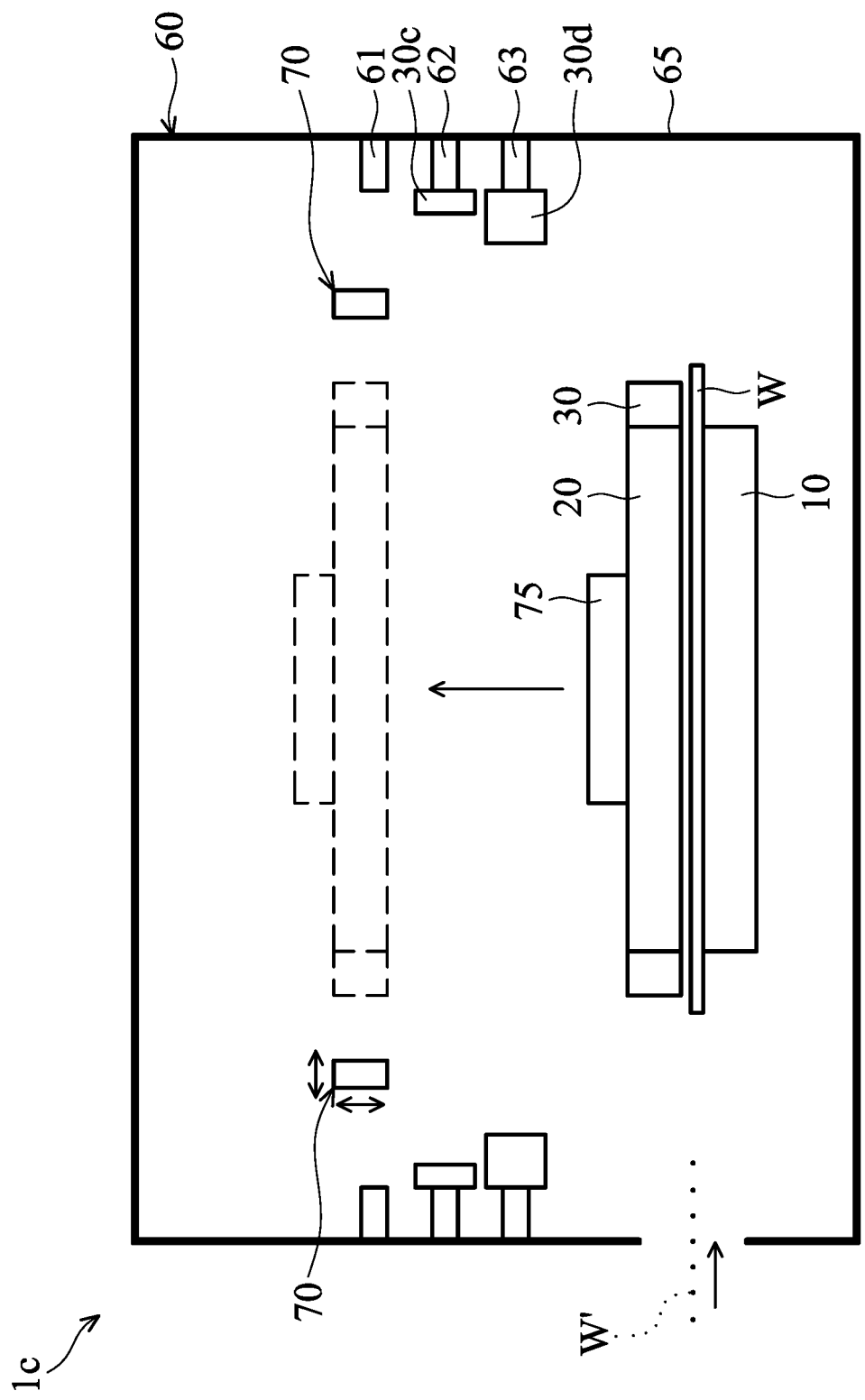
FIG. 8 is a schematic view of a plasma processing apparatus with a transferring module for performing a shadowing unit replacement, in accordance with some embodiments.

FIG. 8 is a schematic view of a plasma processing apparatus 1c with a transfer module for performing a shadowing unit replacement, in accordance with some embodiments. In the embodiments shown in FIG. 8, elements similar to those shown in FIG. 1 are provided with the same reference numbers, and the features thereof are not reiterated in the interests of brevity.

In some embodiments, the plasma processing apparatus 1c further includes two shadowing units 30c and 30d, a chamber 60, three brackets 61, 62 and 63, a transfer module 70 and a support 75. The brackets 61, 62 and 63 are positioned on the side wall 65 of the chamber 60.

The shadowing units 30c and 30d are positioned on the brackets 62 and 63. The shadowing units 30c and 30d have a similar shape to that of the shadowing unit 30 but have outer widths that are different from the outer width of the shadowing unit 30. For example, as shown in FIG. 8, the outer width of the shadowing unit 30c is smaller than the outer width of the shadowing unit 30, and the outer width of the shadowing unit 30d is greater than the outer width of the shadowing unit 30.

Since the areas to be etched between the individual wafers are not the same, different plasma exclusion zones are preferably used in the processing of different wafers. The method for change the upper plasma exclusion zone is described below.

In some embodiments, to modify the upper plasma exclusion zone, the upper sheltering module 20 is moved away from the lower upper sheltering module 10 by the support 75 to the position indicated by the dotted line in FIG. 8. In the same time, the wafer W may be removed from the lower sheltering module 10, and another wafer W' is transferred into the chamber 60.

Afterwards, the shadowing unit 30 is detached from the upper sheltering module 20 by the transfer module 70 and is positioned on the bracket 61. Afterward, the shadowing unit 30c or the shadowing unit 30d is loaded onto the exterior of the upper sheltering module 20, and the upper sheltering module 20 is lowered down again to cover the front surface of the wafer W'. However, it should be appreciated that many variations and modifications can be made to embodiments of the disclosure. In some other embodiments, there is no shadowing unit mounted on the upper sheltering module 20. Afterwards, a bevel etching process is performed on the wafer W'.

Embodiments of the plasma processing apparatus for performing a bevel etching process over the wafer employ a shadowing unit to adjust plasma exclusion zone. Since the shadowing unit is selectively mounted on an upper sheltering module, a plasma exclusion zone is able to be more quickly adjusted than a conventional apparatus. As a result, wafers with different features can be processed properly without the need to replace the upper sheltering module. Moreover, since the shadowing unit is disposed on the side of the upper sheltering module close to the plasma, plasma is blocked from striking the upper sheltering module directly. Therefore, the erosion problem of the upper sheltering module is mitigated. The lifespan of the upper sheltering module is increased, and the cost of manufacturing is reduced.

In accordance with some embodiments, the disclosure provides a plasma processing apparatus for performing a bevel etching process over a wafer. The apparatus includes a lower sheltering module. The apparatus further includes an upper sheltering module arranged adjacent to the lower sheltering module. The upper sheltering module includes an upper plate and an upper PEZ ring positioned around the upper plate. The apparatus also includes a shadowing unit. The shadowing unit includes a number of engaging parts in the form of arcs detachably positioned around the upper PEZ ring. In addition, the apparatus includes a plasma generation module. The plasma generation module is used to generate plasma in the peripheral region of the lower sheltering module and the upper sheltering module.

In accordance with some embodiments, the disclosure provides a plasma processing apparatus for performing a bevel etching process over a wafer. The apparatus includes a lower sheltering module. The apparatus further includes an upper sheltering module arranged adjacent to the lower sheltering module. The upper sheltering module includes an upper PEZ ring having a base portion and a connecting portion downwardly projected from the base portion. A recess is formed on the connecting portion, and a lower wall of the recess is distant from the bottom surface of the connecting portion. The apparatus also includes a plasma generation module. The plasma generation module is used to generate plasma in the peripheral region of the lower sheltering module and the upper sheltering module.

In accordance with some embodiments, the disclosure provides a plasma processing apparatus for performing a bevel etching process over a wafer. The apparatus includes a chamber having a side wall. The apparatus further includes a lower sheltering module and an upper sheltering module both are positioned in the chamber and arranged adjacent to each other. The apparatus also includes a plasma generation module. The plasma generation module is used to generate plasma in the peripheral region of the lower sheltering module and the upper sheltering module. In addition, the apparatus a number of brackets and a number of shadowing units. The brackets are positioned on the side wall. The shadowing units positioned on the brackets and adapted to be positioned on the exterior of the upper sheltering module in a radial direction. The apparatus further includes a transfer module configured to transfer the shadowing units from the brackets to the upper sheltering module.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A plasma processing apparatus, comprising:
a lower sheltering module;
an upper sheltering module arranged adjacent to the lower sheltering module and comprising:
an upper plate; and
an upper PEZ ring positioned around the upper plate;
a shadowing unit detachably positioned in a recess of the upper PEZ ring; and
a plasma generation module configured to generate plasma in a peripheral region of the lower sheltering module and the upper sheltering module, comprising:
a lower electrode unit disposed adjacent to the lower sheltering module; and
an upper electrode unit disposed adjacent to the upper sheltering module.

2. The plasma processing apparatus as claimed in claim 1, wherein the upper PEZ ring has a base portion and a connecting portion downwardly projected from the base portion, and the shadowing unit is positioned on the connecting portion.

3. The plasma processing apparatus as claimed in claim 2, wherein the connecting portion has a bottom surface for defining an upper plasma exclusion zone for protecting the wafer from being exposed to plasma and a connecting surface immediately connected to the bottom surface, wherein the shadowing unit is positioned on the connecting surface.

4. The plasma processing apparatus as claimed in claim 3, wherein the bottom surface of the connecting portion is flush with a bottom surface of the shadowing unit for defining the upper plasma exclusion zone.

5. The plasma processing apparatus as claimed in claim 1, wherein the outer width of the shadowing unit across the upper sheltering module is smaller than the diameter of the wafer.

6. The plasma processing apparatus as claimed in claim 1, wherein the shadowing unit comprises two engaging parts each having an arc angle of about 180 degrees and circumferentially positioned on the upper PEZ ring.

7. The plasma processing apparatus as claimed in claim 1, wherein the upper PEZ ring and the shadowing unit are made of the same material selected from a group comprising quartz, $Al_2O_3$, $Si_3N_4$, AlN, $Y_2O_3$ and $TiO_2$.

8. The plasma processing apparatus as claimed in claim 1, wherein the upper PEZ ring and the shadowing unit are coated with an anti-corrosion material.

9. A plasma processing apparatus, comprising:
a lower sheltering module;
an upper sheltering module arranged adjacent to the lower sheltering module and comprising an upper PEZ ring having a base portion and a connecting portion downwardly projected from the base portion, wherein a recess is formed on the connecting portion, and a lower wall of the recess is distant from a bottom surface of the connecting portion, and a groove is formed on the lower wall of the recess; and
a plasma generation module configured to generate plasma in the peripheral region of the lower sheltering module and the upper sheltering module, comprising:
a lower electrode unit disposed adjacent to the lower sheltering module; and
an upper electrode unit disposed adjacent to the upper sheltering module.

10. The plasma processing apparatus as claimed in claim 9, further comprising a shadowing unit positioned at the connecting portion, wherein the shadowing unit comprises:
a longitudinal portion extending parallel to the connecting portion; and
an engaging portion connected to the longitudinal portion and positioned in the recess.

11. The plasma processing apparatus as claimed in claim 10, wherein the bottom surface of the connecting portion is flush with the bottom surface of the shadowing unit.

12. The plasma processing apparatus as claimed in claim 10, wherein the shadowing unit comprises two arc-shaped parts circumferentially positioned on the upper PEZ ring.

13. The plasma processing apparatus as claimed in claim 10, wherein a portion of the engaging portion is positioned in the groove.

14. The plasma processing apparatus as claimed in claim 10, wherein the upper PEZ ring and the shadowing unit are made of the same material selected from a group comprising quartz, $Al_2O_3$, $Si_3N_4$, AlN, $Y_2O_3$ and $TiO_2$.

15. The plasma processing apparatus as claimed in claim 10, wherein the upper PEZ ring and the shadowing unit are coated with an anti-corrosion material.

16. The plasma processing apparatus as claimed in claim 9, wherein the recess continuously surrounds the connecting portion.

17. The plasma processing apparatus as claimed in claim 9, wherein the recess has a rectangular or triangular cross section.

18. A plasma processing apparatus, comprising:
   a lower sheltering module;
   an upper sheltering module arranged adjacent to the lower sheltering module and comprising an upper PEZ ring having a base portion and a connecting portion downwardly projected from the base portion, wherein a recess is formed on and continuously surrounds the connecting portion;
   a shadowing unit positioned at the connecting portion, wherein the shadowing unit comprises:
   a longitudinal portion extending parallel to the connecting portion; and
   an engaging portion connected to the longitudinal portion and positioned in the recess; and
   a plasma generation module configured to generate plasma in the peripheral region of the lower sheltering module and the upper sheltering module, comprising:
   a lower electrode unit disposed adjacent to the lower sheltering module; and
   an upper electrode unit disposed adjacent to the upper sheltering module.

19. The plasma processing apparatus as claimed in claim 18, wherein the shadowing unit is detachably positioned on the upper PEZ ring.

20. The plasma processing apparatus as claimed in claim 18, wherein the recess continuously surrounds the connecting portion.

* * * * *